(12) United States Patent
Lachman

(10) Patent No.: US 11,156,671 B2
(45) Date of Patent: Oct. 26, 2021

(54) SYSTEM AND METHOD FOR PERFORMING TRANSFORMER DIAGNOSTICS

(71) Applicant: Doble Engineering Company, Watertown, MA (US)

(72) Inventor: Mark F. Lachman, San Jose, CA (US)

(73) Assignee: DOBLE ENGINEERING COMPANY, Watertown, MA (US)

(*) Notice: Subject to any disclaimer, the term of this patent is extended or adjusted under 35 U.S.C. 154(b) by 125 days.

(21) Appl. No.: 16/752,125

(22) Filed: Jan. 24, 2020

(65) Prior Publication Data

US 2020/0158789 A1    May 21, 2020

Related U.S. Application Data

(63) Continuation of application No. 16/261,309, filed on Jan. 29, 2019, now Pat. No. 10,545,183, which is a
(Continued)

(51) Int. Cl.
*G01R 31/36* (2020.01)
*G01R 29/20* (2006.01)
(Continued)

(52) U.S. Cl.
CPC .................... *G01R 31/62* (2020.01)

(58) Field of Classification Search
CPC ...... G01R 31/02; G01R 31/027; G01R 31/06; G01R 31/36; G01R 29/20; G01R 29/22; G01R 29/26; G06F 19/00
See application file for complete search history.

(56) References Cited

U.S. PATENT DOCUMENTS

| | | | |
|---|---|---|---|
| 5,216,356 | A | 6/1993 | Owen |
| 8,428,895 | B2 | 4/2013 | Werelius et al. |

(Continued)

FOREIGN PATENT DOCUMENTS

| | | |
|---|---|---|
| CN | 202533520 U | 11/2012 |
| CN | 103328990 A | 9/2013 |

(Continued)

OTHER PUBLICATIONS

First Office Action for Chinese Application No. 201880005433.2 dated Jun. 1, 2021, 5p, in Chinese language.
(Continued)

*Primary Examiner* — Neel D Shah
(74) *Attorney, Agent, or Firm* — Crowell & Moring LLP

(57) ABSTRACT

A method for performing diagnostics on a target transformer includes applying a voltage output of a voltage generator to a winding or phase of the target transformer; controlling the voltage generator to output an AC voltage at a first frequency and then a second frequency and measuring first and second excitation currents flowing into the target transformer associated with the first frequency and second frequency, respectively. The method further includes determining an actual excitation current of the target transformer as a function of both the first and second excitation currents, and comparing the actual excitation current of the target transformer to excitation currents associated with one or more benchmark transformers having known electrical characteristics. And when the actual excitation current of the target transformer matches an excitation current of one of benchmark transformers, determining the electrical characteristics of the target transformer to match electrical characteristics of the one benchmark transformer.

20 Claims, 5 Drawing Sheets

Related U.S. Application Data continuation of application No. 15/436,403, filed on Feb. 17, 2017, now Pat. No. 10,203,364.

(51) Int. Cl.
*G01R 29/22* (2006.01)
*G01R 31/62* (2020.01)

(56) References Cited

U.S. PATENT DOCUMENTS

| | | | |
|---|---|---|---|
| 9,322,866 | B2 | 4/2016 | Abeywickrama et al. |
| 10,075,117 | B2 | 9/2018 | Wu et al. |
| 11,016,517 | B2 | 5/2021 | Meinecke |
| 2003/0139891 | A1 | 7/2003 | Coffeen |
| 2007/0179726 | A1 | 8/2007 | Bickel |
| 2010/0106435 | A1 | 4/2010 | Werelius et al. |
| 2010/0161259 | A1 | 6/2010 | Kim et al. |
| 2012/0139555 | A1 | 6/2012 | Mayfield et al. |
| 2013/0282197 | A1 | 10/2013 | Labuschagne et al. |
| 2014/0118015 | A1 | 5/2014 | Milner, Jr. et al. |
| 2015/0098156 | A1 | 4/2015 | Rowny, Jr. et al. |
| 2015/0268291 | A1* | 9/2015 | Lachman ............... G01R 31/12 324/547 |
| 2018/0003760 | A1 | 1/2018 | Flax et al. |

FOREIGN PATENT DOCUMENTS

| | | |
|---|---|---|
| CN | 103329385 A | 9/2013 |
| CN | 105352427 A | 2/2016 |
| CN | 106104996 A | 11/2016 |
| WO | WO 2016/113072 A1 | 7/2016 |

OTHER PUBLICATIONS

Chen, Yu, "Electromagnetic Valves and Applications thereof", China Academic Journal Electronic Publishing House, dated Feb. 2, 1988, pp. 22-24, in Chinese language.

Search Report for Chinese Application No. 201880005433.2 dated May 26, 2021, 2p, in Chinese language.

Rickley, A. L. and Clark, R. E. "Transformer Exciting Current Measured with Doble Equipment (A Progress Report)," Minutes of the Thirty-Fifth Annual International Conference of Doble Clients, 1968, Sec. 6-1001.

Lachman, M. F. "Field Measurements of Transformer Single-Phase Exciting Current as a Diagnostic Tool, and Influence of Load Tap Changers," IEEE Transactions on Power Delivery, Jul. 1994, vol. 9, No. 3, pp. 1466-1475.

Poulin, B. "Exciting Current of Power Transformers," Proceedings of the Sixty-Third Annual International Conference of Doble Clients, 1996, Sec. 8-9.

Lachman, M. F. "Application of Equivalent Circuit Parameters to Off-Line Diagnostics of Power Transformers (A Review)", Proceedings of the Sixty-Sixth Annual International Conference of Doble Clients, 1999, Sec. 8-10.

Lachman, M. F. and Shafir, Y. N. "Single-Phase Exciting Current and Loss Measurement—Visualizing Physics Behind Data", Proceedings of the Eighty-Second Annual International Conference of Doble Clients, 2015, Sec. T-5.

Lachman, M. F. and Shafir, Y. N. "Capacitive Current Component in Single-Phase Exciting Current and Loss Measurement", Proceedings of the Eighty-Third Annual International Conference of Doble Clients, 2016, Sec. T-2.

Extended European Search Report from corresponding European Patent Application No. 18748842.4, dated Sep. 17, 2019, 6p.

* cited by examiner

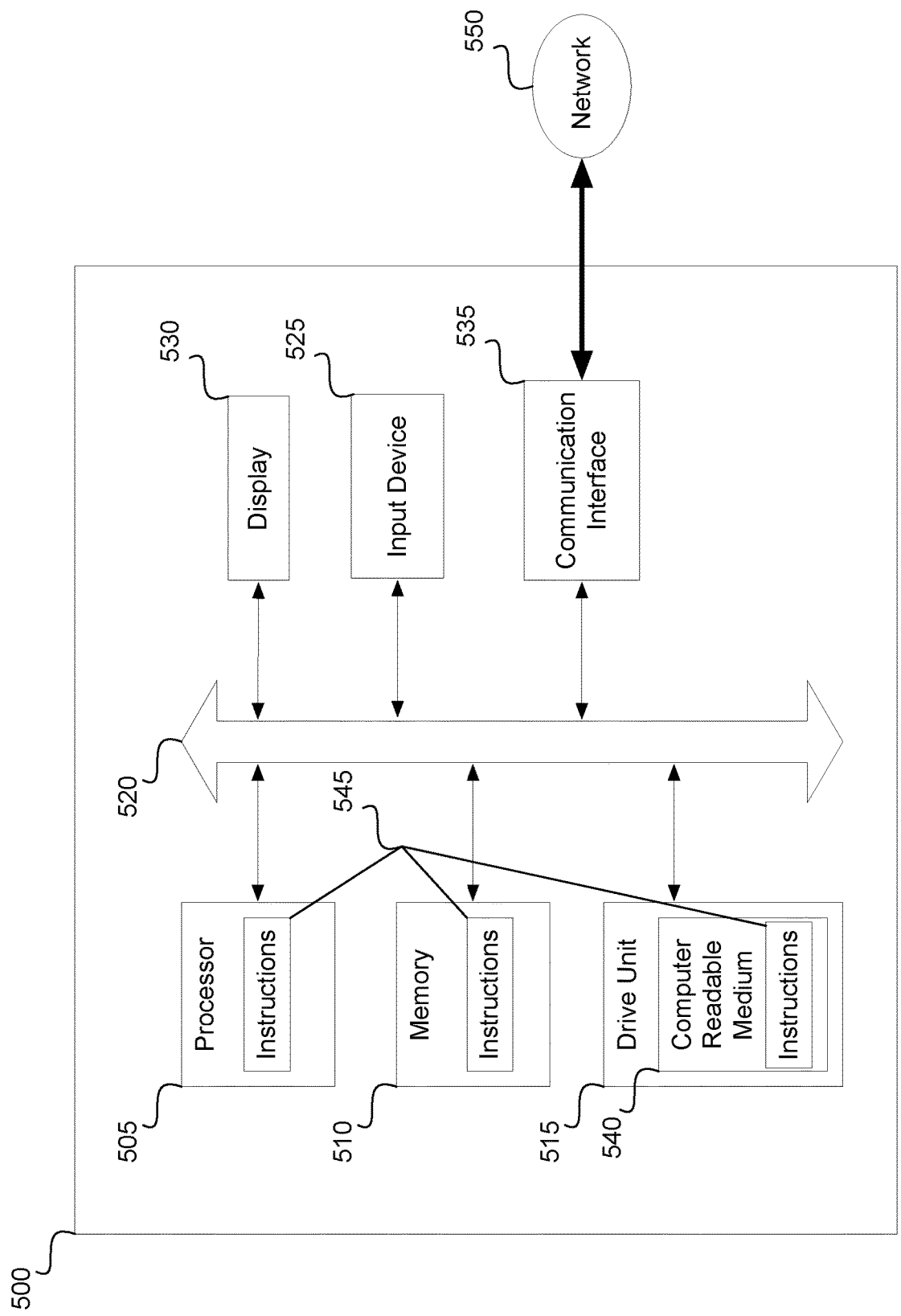

SYSTEM AND METHOD FOR PERFORMING TRANSFORMER DIAGNOSTICS

RELATED APPLICATIONS

This application is a continuation pursuant to 35 U.S.C. § 120 of U.S. patent application Ser. No. 16/261,309, filed Jan. 29, 2019, which is a continuation pursuant to 35 U.S.C. § 120 of U.S. patent application Ser. No. 15/436,403, filed Feb. 17, 2017, all of which are entirely incorporated herein by reference.

BACKGROUND

Field

This application relates to a diagnostic system. In particular, this application describes a system and method for performing diagnostics on a transformer.

Description of Related Art

High voltage transformers are utilized in the delivery of power and are commonly utilized to step down voltages present on transmission lines to voltages more suitable for residential or commercial areas. Transformers generally include one or more primary windings and one or more secondary windings. In the case of a 3-phase electrical system, the primary windings may comprise three windings, each of which is coupled to a different phase of the electrical system.

The voltage delivered to a load is somewhat dependent on the load itself. Therefore, some high voltage transformers incorporate a load-tap-changer (LTC) and/or a de-energized tap changer (DETC). LTCs and DETCs are a switch mechanism that facilitate changing the turns ratio of the transformer. LTC/DETCs change position to control its output voltage.

High voltage transformers tend to undergo a large amount of stress during operation. This is especially the case during periods of peak-power usage, such as during warm days in the summer. The stress may result in degradation in the performance of the transformer. For example, insulation between the windings may degrade; shorts may begin to develop between adjacent turns or windings. Other problems may occur. If these problems persist for long enough, the transformer may catastrophically fail. This failure may, in turn, cause other components of the power system to fail.

In an attempt to minimize these sorts of disruptions, transformers typically undergo routine diagnostic testing after being installed to ascertain whether there are any issues that may lead to an eventual catastrophic failure. One test employed is to energize the windings or phases of the transformer with an AC voltage and to measure the magnitude of the power frequency component of the excitation current flowing into the transformer.

Unfortunately, in certain modern power transformers, the capacitive component of the excitation current distorts the expected patterns of the measured current making conclusions of diagnostic analysis less certain.

BRIEF SUMMARY

Methods, systems, and computer-readable media are provided that facilitate performing diagnostics on a transformer.

In one aspect, a method for performing diagnostics on a target transformer includes applying a voltage output of a voltage generator to a winding or phase of the target transformer; controlling the voltage generator to output an AC voltage at a first frequency and then a second frequency and measuring first and second excitation currents flowing into the target transformer associated with the first frequency and second frequency, respectively. The method further includes determining an actual excitation current of the target transformer as a function of both the first and second excitation currents, and comparing the actual excitation current of the target transformer to excitation currents associated with one or more benchmark transformers having known electrical characteristics. And when the actual excitation current of the target transformer matches an excitation current of one of benchmark transformers, determining the electrical characteristics of the target transformer to match electrical characteristics of the one benchmark transformer.

In a second aspect, a system for performing diagnostics on a target transformer is provided. The system includes a voltage generator that generates an AC voltage at a first frequency and a second frequency, a switch section configured to selectively apply the AC voltage to one of a plurality of windings or phases of the target transformer, a current sensor configured to sense a current flowing through a selected winding or phase of the target transformer, a processor in communication with the voltage generator, the switch section, and the current sensor; and non-transitory computer readable media in communicating with the processor. The non-transitory computer readable media stores instruction code that when executed by the processor causes the processor to perform acts comprising: a) controlling the switch circuitry to apply a voltage output of the voltage generator to a winding or phase of the target transformer; b) controlling the voltage generator to output an AC voltage at a first frequency; c) measuring, via the current sensor, a first excitation current flowing into the target transformer associated with the first frequency; d) controlling the voltage generator to output an AC voltage at a second frequency; e) measuring, via the current sensor, a second excitation current flowing into the target transformer associated with the second frequency; f) determining an actual excitation current of the target transformer as a function of both first and second excitation currents; g) comparing the determined actual excitation current of the target transformer to excitation currents associated with one or more benchmark transformers having known electrical characteristics. When the actual excitation current of the target transformer matches an excitation current of one of benchmark transformers, the instruction code causes the processor to determine the electrical characteristics of the target transformer to match electrical characteristics of the one benchmark transformer.

In a third aspect, a non-transitory machine-readable storage medium that stores a computer program for performing diagnostics on a target transformer is provided. The program is executable by the machine and causes the machine to perform acts of: a) controlling switch circuitry to apply a voltage output of a voltage generator to a winding or phase of the target transformer; b) controlling the voltage generator to output an AC voltage at a first frequency; c) measuring, via a current sensor, a first excitation current flowing into the target transformer associated with the first frequency; d) controlling the voltage generator to output an AC voltage at a second frequency; e) measuring, via the current sensor, a second excitation current flowing into the target transformer associated with the second frequency; f) determining an actual excitation current of the target transformer as a function of both first and second excitation currents; g) comparing the determined actual excitation current of the target transformer to excitation currents associated with one or more benchmark transformers having known electrical characteristics; and when the actual excitation current of the target transformer matches an excitation current of one of benchmark transformers, determining the electrical characteristics of the target transformer to match electrical characteristics of the one benchmark transformer.

BRIEF DESCRIPTION OF THE DRAWINGS

FIG. 5 illustrates a computer system that may implement various modules of system.

DETAILED DESCRIPTION

The embodiments described below overcome the problems above by providing a system that is capable of performing more complete diagnostic analysis of a target transformer. Generally, the system is configured to drive one or more windings or phases of a target transformer with a sinusoidal AC voltage and to measure characteristic parameters of an excitation current that flows into the windings/phases of the target transformer. The parameters are compared with parameters associated with so-called benchmark transformers or the previous data of the target transformer to determine whether the target transformer matches the characteristics of a given benchmark transformer. The benchmark transformers may include transformers that are properly functioning transformers and transformers that exhibit a particular kind of defect.

In operation, the parameters associated with the target transformer may be compared with corresponding parameters associated with a benchmark transformer that represents a properly functioning transformer or the previous data of the target transformer to determine whether the target transformer is in working order. On the other hand, the parameters associated with the target transformer may match the parameters associated with a benchmark transformer that, for example, has a shorted winding or other defect. In this case, the target transformer may be determined to have a shorted winding.

Figure 1:
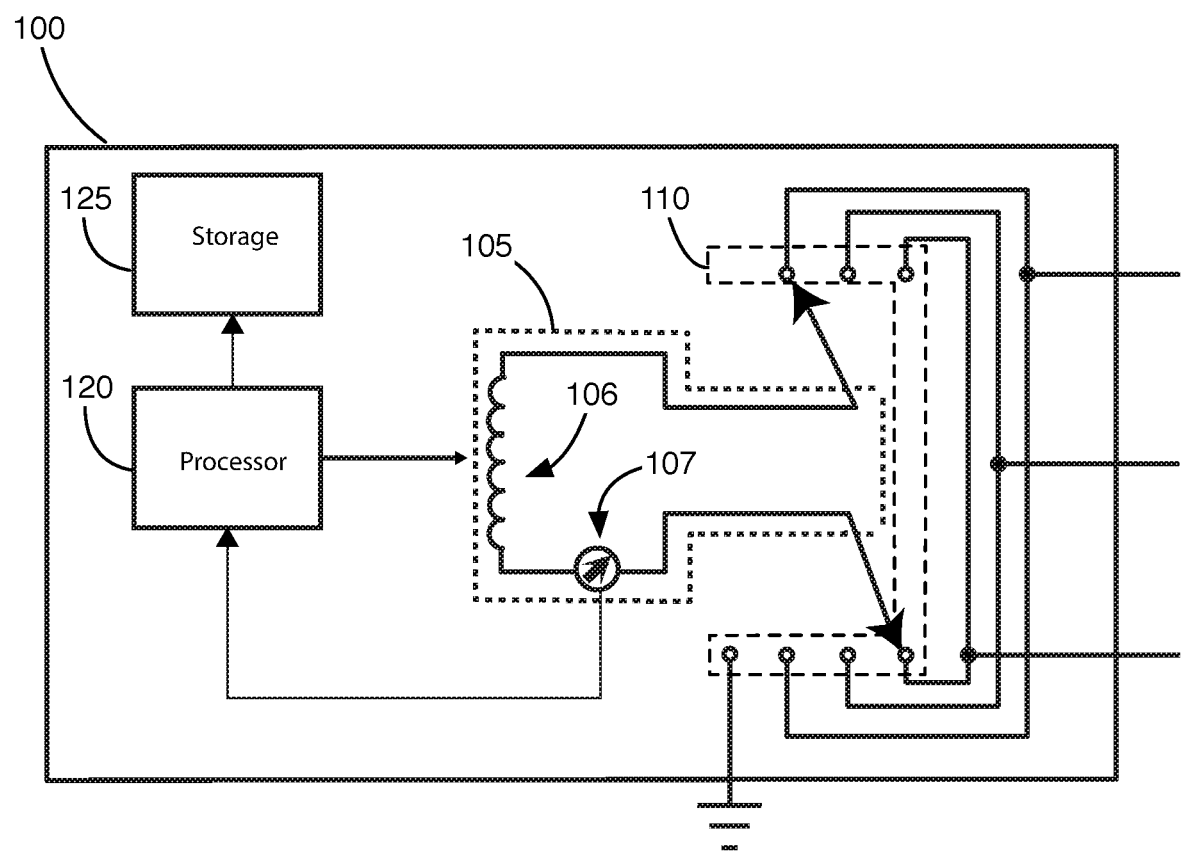
FIG. 1 illustrates an exemplary system for performing diagnostics on a target transformer.

FIG. 1 illustrates an exemplary system 100 for performing diagnostics on a transformer. The system 100 includes a voltage generator section 105, a switch section 110, a processor 120, and a storage device 125. The voltage generator section 105 includes a voltage source 106 and a current measuring device 107. The voltage source is configured to generate a voltage that is typically lower than the voltage applied to the target transformer when in normal in-service use. For example, the test voltage may be about 12 kV. The resulting current into the target transformer may be a non-sinusoidal AC current.

The current measuring device 107 is configured to measure the excitation current flowing from the voltage source 106 to the winding of a target transformer. The current measuring device 107 may include a current sensing portion, such as a small resistance. Current flowing through the resistance results in a voltage drop across the resistance. The current measuring device 107 may include analog-to-digital conversion circuitry that samples the voltage developed across the resistance and communicates a digital representation of the sampled voltage to the processor 120.

Figure 2A:
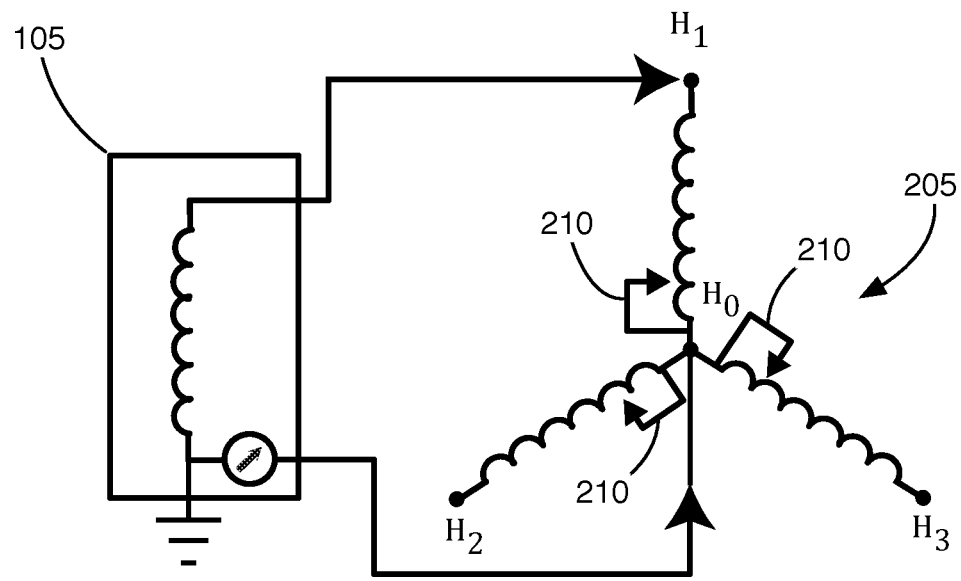
FIGS. 2A and 2B illustrate exemplary transformer configurations to which outputs of the system of FIG. 1 may be coupled.
Figure 2B:
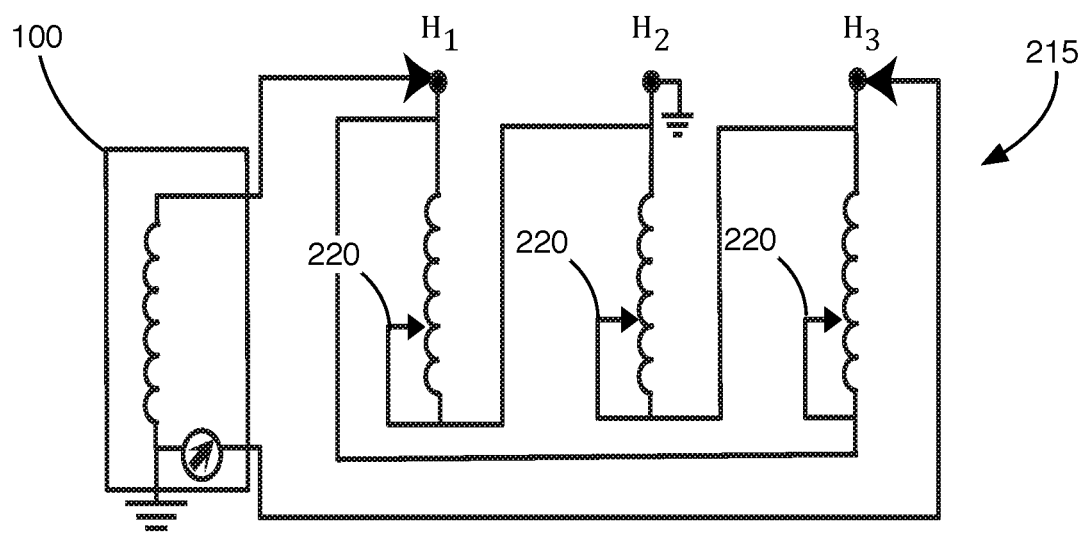

The switch section 110 is configured to route the outputs of the voltage generator section 105 to different windings of a target transformer. The switch section 110 may correspond to a mechanical or solid-state switch. FIGS. 2A and 2B illustrate exemplary transformer configurations that may be coupled to the switch section 110. FIG. 2A illustrates a Y-type transformer 205 that includes an LTC/DETC 210. The switch section 110 may couple a first voltage generator output to a center node, H0, of the transformer 205. The switch section 110 may couple the other output to one of nodes H1, H2, and H3 to facilitate measuring the excitation current flowing within one of windings H1-H0, H2-H0, or H3-H0. FIG. 2B illustrates a different transformer 215 that includes an LTC/DETC 220 where access to a neutral node of the transformer may not be provided. In this case, the switch section 110 may couple the outputs of the voltage generator section 105 to one of nodes H1, H2, and H3, to facilitate measuring the excitation current flowing within one of windings/phases H1-H2, H1-H3, or H2-H3.

Returning to FIG. 1, the processor 120 is configured to compare the current components associated with the exciting current with previously determined component data associated with the target transformer or benchmark transformers. The processor 120 may be in communication with the voltage generator section 105 and the switch section 110 to control operation of the respective sections. For example, the processor 120 may control activation of the voltage generator 106 of the voltage generator section 105 and may control an output voltage and frequency of the voltage generator section 105. The processor 120 may control the switch configuration of the switch section 110 to route voltage from the voltage regulator section 105 to select a specific winding/phase of a target transformer.

In some implementations, the processor 120 may be configured to communicate information and/or instructions to an operator. For example, the system 100 may include a display or a network interface that facilitates communication of instructions to an operator to have the operator select a particular LTC/DETC position when testing the operation of a target transformer. In alternative implementations, the processor 120 may be in control of a servo or other form of actuator that is coupled to the LTC/DETC of the target transformer to facilitate automatic changing of the LTC/DETC position during testing.

Figure 3:
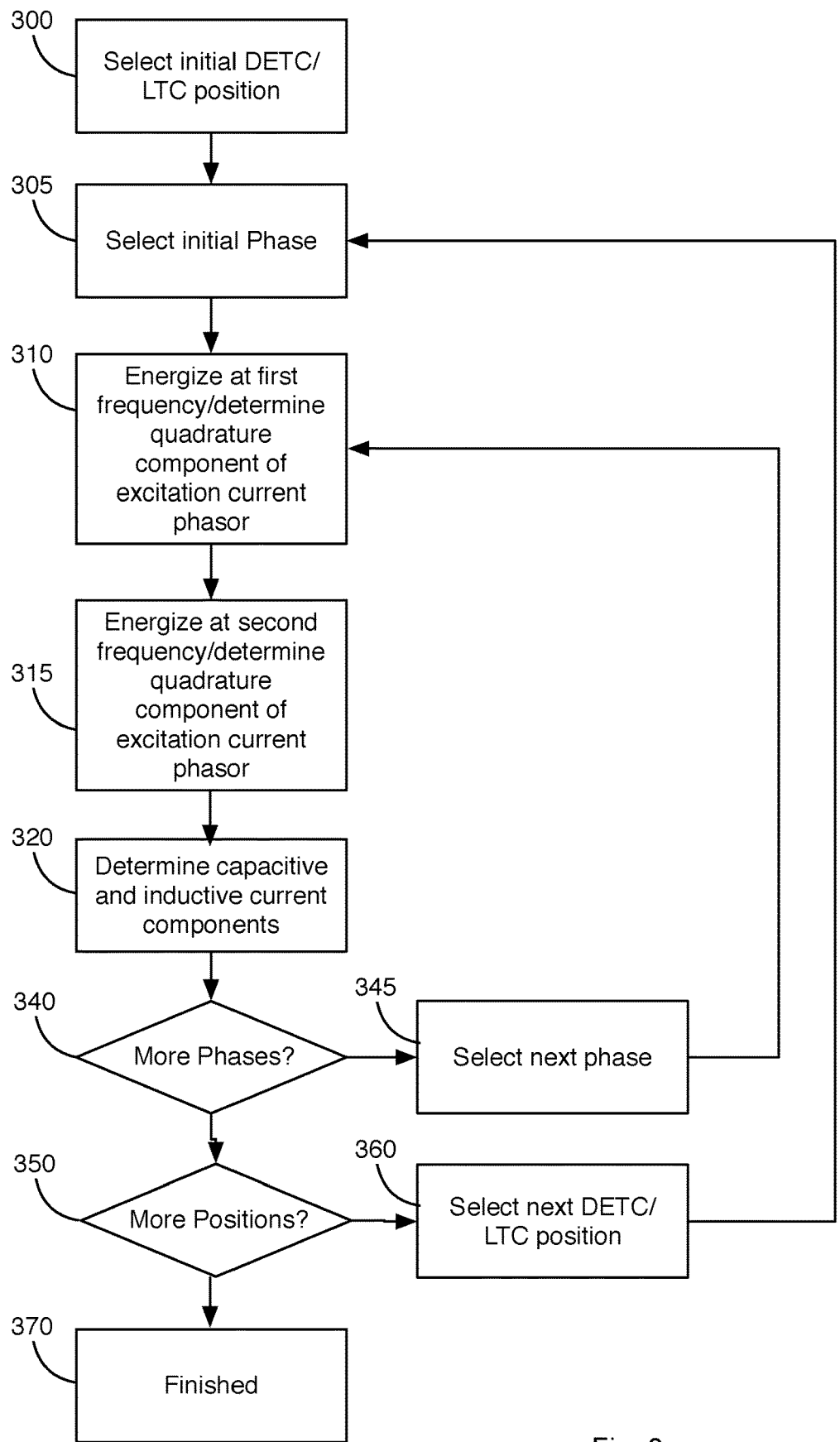
FIG. 3 illustrates various exemplary operations that may be performed by the system.

Operations performed by the system 100 are illustrated in the flow diagram of FIG. 3. To facilitate performance of the various operations, one or more non-transitory types of memories, such as RAM, ROM, flash, etc., may be in communication with the processor 120 and may store instruction code executable by the processor 120 to cause the processor 120 to carry out all or part of the various operations.

At block 300, selection of an initial LTC/DETC position may be performed. For example, an instruction for setting the LTC/DETC position of the target transformer to an initial position, such as LTC/DETC position 1, may be communicated to an operator via a display.

At block 305, the switch section 110 may be controlled to route voltage outputs of the voltage generator section 105 to a first phase or winding of the target transformer. For example, the processor 120 may control the switch section 110 to select phase H1-H3 of the transformer, as illustrated in FIG. 2B.

At block 310, the voltage generator 106 of the voltage generator section 105 may be energized at a first frequency, and the current phasor of the exciting current associated with the first frequency may be captured. For example, when energized the voltage generator 106 may generate a 12 kV sinusoidal AC voltage at a frequency about 5% below a normal operating frequency of the target transformer, such as 57 Hz when the normal operating frequency is 60 Hz. A lower frequency may result in the inductance of the transformer becoming non-linear. Generation of the voltage results in exciting current flow through the selected winding/phase of the target transformer.

The current measuring device 107 of the voltage generator section 105 may measure the magnitude and phase of the current with respect to the phase of the voltage source to determine in-phase (I) and out-of-phase (Q) components of the current flowing into the target transformer. For example, the current measuring device 107 may digitally sample a voltage developed across a sense resistor and based on the samples determine the in-phase (I) and out-of-phase (Q) components of the current. As noted above, the current flowing into the target transformer may be a non-sinusoidal AC current. In this case, determination of the I and Q components of the current may require determining the first harmonic waveform of the measured current. For example, a filter or harmonic analyzer may be utilized to determine the first harmonic.

Figure 4A:
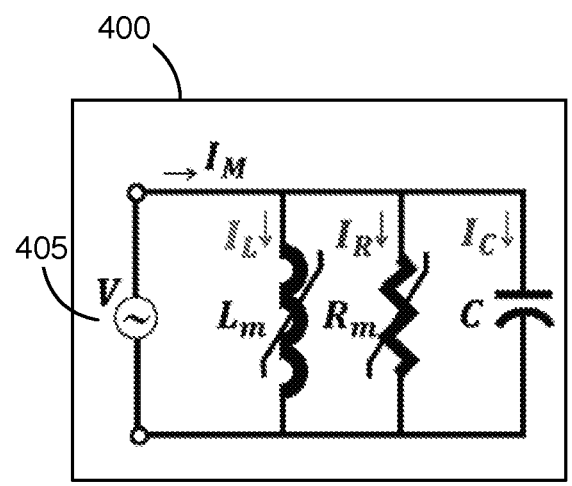
FIG. 4A illustrates an exemplary circuit representation of a phase of a transformer.

FIG. 4A illustrates various currents flowing through-out an exemplary circuit representation 400 of a single phase of a transformer. As shown, the transformer phase may be represented as the parallel combination of inductor $L_m$, resistor $R_m$, and capacitor C. The voltage source sources current $I_m$ into the parallel combination of components, where $I_m$ equals the sum of currents $I_L$, $I_R$, and $I_C$, which flow respectively through inductor $L_m$, resistor $R_m$, and capacitor C.

Figure 4B:
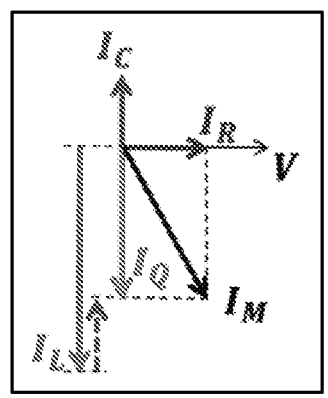
FIG. 4B illustrates a vector representation of current flowing into the exemplary circuit of FIG. 4A.

FIG. 4B illustrates a vector representation of the various current components. As shown, the in-phase current ($I_R$) corresponds to the current $I_R$ that flows through the equivalent resistance of the transformer phase. The magnitude of the out-of-phase current ($I_Q$) corresponds to the difference between the magnitudes of currents $I_L$ and $I_C$ that flow respectively through the equivalent inductor and capacitor of the transformer phase.

Returning to FIG. 3, at block 315, the voltage generator 106 of the voltage generator section 105 may be energized at a second frequency, and the in-phase (I) and out-of-phase (Q) components current phasor of the exciting current associated with the second frequency may be captured. For example, the voltage generator 106 may be controlled to generate a 12 kV sinusoidal AC voltage at a frequency about 5% above a normal operating frequency of the target transformer, such as 63 Hz when the normal operating frequency is 60 Hz. A higher frequency may result in the inductance of the transformer becoming non-linear. The in-phase (I) and out-of-phase (Q) components of the current at this frequency may be captured.

At block 320, the currents $I_L$ and $I_C$ flowing through inductor $L_m$ and capacitor C, respectively, may be determined based on the in-phase (I) and out-of-phase (Q) component current measurements performed in blocks 310 and 315. In one implementation, the currents associated with the inductive and capacitive components are determined according to the following methodology:

The quadrature component of the current measured at a lower frequency $f_1$ (e.g., 60 Hz) may be expressed as:

$$I_{Q1}=I_{L1}+I_{C1} \quad (1)$$

The quadrature component of the current measured at a higher frequency f2 (e.g., 70 Hz) may be expressed as:

$$I_{Q2}=I_{L2}+I_C \quad (2)$$

Using the applied voltage as reference, the inductive and capacitive components can be expressed as follows:

$$I_{L1}=V/j\omega_1 L \quad (3)$$

$$I_{C1}=jV\omega_1 C \quad (4)$$

$$I_{L2}=V/j\omega_2 L \quad (5)$$

$$I_{C2}=jV\omega_2 C \quad (6)$$

$$I_L=V/j\omega L \quad (7)$$

$$I_C=jV\omega C \quad (8)$$

where $\omega_1=2\pi f_1$, $\omega_2=2\pi f_2$, $\omega=2\pi f$, $f_1<f<f_2$ and f is the power frequency.

Using, $$\omega_1=\omega-\Delta\omega \quad (9)$$

$$\omega_2=\omega+\Delta\omega \quad (10)$$

$$\xi=\Delta\omega/\omega=\Delta f/f \quad (11)$$

equations (3-8), (1) and (2) can be rewritten as:

$$I_{Q1}=V/j\omega_1 L+jV\omega_1 C=I_L/(1-\xi)+I_C(1-\xi) \quad (12)$$

Similarly, $$I_{Q2}=I_L/(1+\xi)+I_C(1+\xi) \quad (13)$$

From (12):

$$I_L=I_{Q1}(1-\xi)-I_C(1-\xi)^2 \quad (14)$$

Substituting (14) into (13) yields:

$$I_{Q2}=I_{Q1}(1-\xi)/(1+\xi)+I_C[4\xi/(1+\xi)] \quad (15)$$

From (15), $$I_C=(1/4\xi)[I_{Q2}(1+\xi)-I_{Q1}(1-\xi)] \quad (16)$$

Substituting (16) into (14) yields:

$$I_L=[(1-\xi^2)/4\xi][I_{Q1}(1+\xi)-I_{Q2}(1-\xi)] \quad (17)$$

After calculation, the calculated currents, $I_L$, $I_C$, and measured current $I_R$. may be stored to the storage device 125 and associated with the current LTC/DETC position and current phase as illustrated in Table 1.

TABLE 1

| LTC/DETC Position | Phase A $I_L$ (mA) | Phase B $I_L$ (mA) | Phase C $I_L$ (mA) | Phase A $I_C$ (mA) | Phase B $I_C$ (mA) | Phase C $I_C$ (mA) | Phase A $I_R$ (mA) | Phase B $I_R$ (mA) | Phase C $I_R$ (mA) |
|---|---|---|---|---|---|---|---|---|---|
| N | 11.2 | 5.7 | 11.3 | 0.2 | 0.7 | 0.3 | 1.2 | 1.7 | 1.3 |
| 1L | 23.3 | 18.0 | 23.3 | 1.3 | 1.0 | 1.3 | 22.3 | 1.0 | 2.3 |
| 2L | 11.3 | 5.8 | 11.3 | 0.3 | 0.8 | 1.3 | 1.3 | 0.8 | 1.3 |
| ... | ... | ... | ... | ... | ... | ... | ... | ... | ... |

Referring to the Table 1, a first record in the database may include the data associated with a first combination of LTC/DETC position and windings/phases. Similarly, a second record includes the data associated with a second combination of LTC/DETC position and windings/phase. Data associated with other bridging and non-bridging LTC/DETC positions may be specified in additional records of the database.

The data may be represented differently to facilitate searching the database according to the different types of patterns described above. For example, records in the database may be arranged to facilitate searching the database for specific LTC/DETC patterns and/or phase patterns. In this way, after a given pattern is determined for the target transformer, the database may be searched according to the pattern type. For example, a phase pattern may be determined for a given combination of LTC/DETC position. The database may be searched for a record associated with the same LTC/DETC position, and the values of the record compared with the determined phase pattern.

When performing diagnostics on a target transformer, the data associated with the target transformer may be compared with data associated with one or more benchmark transformers. Comparison may be made on a measurement-by-measurement basis or on a different basis. For example, current measurements and or the computed currents above associated with all three phases and for all LTC/DETC positions may be compared with corresponding current measurements and or the computed currents of the one or more benchmark transformers. In this case, the current measurements and/or computed currents for all combinations of phases and LTC/DETC positions would have to be performed on the target transformer. Once completed, the current measurements and/or computed currents would be compared to determine whether the target transformer matches the characteristics of the benchmark transformer. In some instances, different weights may be applied to the various components to signify the importance of one component over another. For example, $I_L$ currents may be given a greater weight than $I_C$ currents.

In some instances, iterations through the operations described in FIG. 3 may terminate after an anomaly is first noticed with the target transformer. For example, if an anomaly is detected when performing diagnostics on a first LTC/DETC position, the operations may simply terminate at that point instead of continuing through all other LTC/DETC positions. For example, the calculations of the current components for a given LTC/DETC may be performed and then compared with the current component data associated with a benchmark transformer when set to the same LTC/DETC position. In this case, if the difference between the measurements of the target transformer and the benchmark transformer exceeds a threshold, further analysis on the target transformer may be discontinued.

Alternatively, the measurements may instead be compared to measurements associated with one or more different benchmark transformers to find a benchmark transformer that has similar current component characteristics for the selected LTC/DETC. This may, for example, be utilized to determine a failure mode of the target transformer. For example, the measurements associated with a given LTC/DETC position of the target transformer may match a benchmark transformer that has a shorted winding on the same phase. If the measurements match between the target transformer and the benchmark transformer, the target transformer may be determined to have a shorted winding.

Returning to FIG. 3, at block 340, if there are additional windings or phases to measure, the next winding or phase is selected and the operations repeat from block 310. For example, a three-phase transformer has three windings or sets of windings for each phase. In this case, the current components associated with exciting current flow through each phase or set of windings would be measured.

If at block 340, the measurements have been completed on all the phases, then at block 350, if there are additional LTC/DETC positions to measure, the next LTC/DETC position may be selected and the operations may repeat from block 305. For example, if the target transformer has an LTC/DETC with 16 positions, each position may be selected and the measurements described above performed for all 16 positions. The LTC/DETC positions may include both non-bridging positions and bridging positions, which are positions where two adjacent taps of the target transformer are connected via a preventative autotransformer.

If at block 350 all the LTC/DETC positions have been evaluated, then diagnosis of the target transformer may be completed, as represented by block 370. As noted above in block 320, comparison of the measurements associated with the target transformer to measurements associated with a benchmark transformer may occur after all combinations of LTC/DETC positions and windings/phases have been measured. In this case, comparison may occur at block 370. Alternatively, comparison may be performed after each LTC/DETC position and phase has been exercised.

FIG. 5 illustrates a computer system 500 that may correspond to the processor 120 or form part of any of the modules referenced herein. The computer system 500 may include a set of instructions 545 that the processor 505 may execute to cause the computer system 500 to perform any of the operations described above. The computer system 500 may operate as a stand-alone device or may be connected, e.g., using a network, to other computer systems or peripheral devices.

In a networked deployment, the computer system 500 may operate in the capacity of a server or as a client-user computer in a server-client user network environment, or as a peer computer system in a peer-to-peer (or distributed) network environment. The computer system 500 may also be implemented as or incorporated into various devices, such as a personal computer or a mobile device, capable of executing the instructions 545 (sequential or otherwise) that specify actions to be taken by that machine. Further, each of the systems described may include any collection of subsystems that individually or jointly execute a set, or multiple sets, of instructions to perform one or more computer functions.

The computer system 500 may include one or more memory devices 510 on a bus for communicating information. In addition, code operable to cause the computer system to perform any of the operations described above may be stored in the memory 510. The memory 510 may be a random-access memory, read-only memory, programmable memory, hard disk drive or any other type of memory or storage device.

The computer system 500 may include a display 530, such as a liquid crystal display (LCD), a cathode ray tube (CRT), or any other display suitable for conveying information. The display 530 may act as an interface for the user to see the functioning of the processor 505, or specifically as an interface with the software stored in the memory 510 or in the drive unit 515.

Additionally, the computer system 500 may include an input device 525, such as a keyboard or mouse, configured to allow a user to interact with any of the components of system 500.

The computer system 500 may also include a disk or optical drive unit 515. The disk drive unit 515 may include a computer-readable medium 540 in which the instructions 545 may be stored. The instructions 545 may reside completely, or at least partially, within the memory 510 and/or within the processor 505 during execution by the computer system 500. The memory 510 and the processor 505 also may include computer-readable media as discussed above.

The computer system 500 may include a communication interface 535 to support communications via a network 550. The network 550 may include wired networks, wireless networks, or combinations thereof. The communication interface 535 network may enable communications via any number of communication standards, such as 802.11, 802.12, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein may be employed.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

While methods and systems have been described with reference to certain embodiments, it will be understood by those skilled in the art that various changes may be made and equivalents may be substituted without departing from the scope. In addition, many modifications may be made to adapt a particular situation or material to the teachings without departing from its scope. Therefore, it is intended that the present methods and systems not be limited to the particular embodiment disclosed, but that the disclosed methods and systems include all embodiments falling within the scope of the appended claims.

I claim:

1. A method comprising:
controlling, by a processor of diagnostic equipment, a voltage source to output a voltage to a target transformer at a first frequency;
measuring a magnitude and a phase angle of a first excitation current of the target transformer with respect to the voltage at the first frequency;
controlling, by the processor of diagnostic equipment, the voltage source to output the voltage to the target transformer at a second frequency, the second frequency being greater than or less than the first frequency;
measuring a magnitude and a phase angle of a second excitation current of the target transformer with respect to the voltage at the second frequency;
determining, as a function of the magnitude and phase angle of the first excitation current and the second excitation current, an inductive component, a capacitive component, or both for the target transformer;
determining, by the processor of diagnostic equipment, a pattern for the target transformer, the pattern formed by the inductive component, the capacitive component, or both;
comparing, by the processor of diagnostic equipment, the pattern formed by the inductive component, the capacitive component, or both with another pattern previously determined for the target transformer, a benchmark transformer, or both; and
outputting, by the processor of diagnostic equipment, a diagnostic analysis of the target transformer.

2. The method of claim 1, wherein the first frequency and the second frequency are different than a nominal operating frequency of the target transformer.

3. The method of claim 1, wherein the voltage at the first frequency and the voltage at the second frequency are equal.

4. The method of claim 1, wherein determining, by the processor of diagnostic equipment, the pattern further comprises applying different weights to the inductive component, the capacitive component, or both.

5. The method of claim 1, wherein comparing, by the processor of diagnostic equipment, the pattern comprises identifying, by the processor of diagnostic equipment, the benchmark transformer, the benchmark transformer identified by matching the determined pattern for the target transformer to a pattern associated with the benchmark transformer.

6. The method of claim 5, wherein the benchmark transformer has predetermined electrical characteristics indicative of a diagnosis of an operational characteristic of the target transformer.

7. The method of claim 5, wherein the pattern associated with the benchmark transformer is formed by a plurality of magnitudes of an inductive component, a capacitive component, or both, of the benchmark transformer.

8. The method of claim 1, wherein the target transformer is a three-phase transformer.

9. The method of claim 1, wherein the target transformer includes a load-tap-changer (LTC) or a de-energized tap changer (DETC), wherein the pattern of the target transformer is determined for each position of the LTC or DETC.

10. A system for performing diagnostics on a target transformer, the system comprising:

an input configured to receive voltage from a voltage source;

a switch circuitry configured to selectively apply the voltage to each of a plurality of phases of the target transformer;

a current sensor configured to sense a current flowing in each of the phases of the target transformer;

a processor in communication with the voltage source, the switch circuitry, and the current sensor; and non-transitory computer readable media in communication with the processor that stores instruction code executable by the processor, the instruction code comprising:

instructions executable by the processor to control the switch circuitry to apply the voltage to each phase of the target transformer;

for each phase:

instructions executable by the processor to control the voltage source to output voltage at a first frequency and a second frequency;

instructions executable by the processor to measure, via the current sensor, a magnitude and a phase angle of a first excitation current of the target transformer at the first frequency, and a magnitude and a phase angle of a second excitation current of the target transformer at the second frequency;

instructions executable by the processor to determine inductive components, capacitive components, or both, for each of the plurality of phases of the target transformer based on the first and second excitation currents;

instructions executable by the processor to determine a pattern of the inductive components, capacitive components, or both;

instructions executable by the processor to compare the pattern to another pattern previously determined for the target transformer, a benchmark transformer, or both; and instructions executable by the processor to output a diagnostic analysis of the target transformer.

11. The system of claim 10, wherein the target transformer includes a load-tap-changer (LTC) or de-energized tap changer (DETC), wherein the instructions executable by the processor comprise instructions executable by the processor to change the load-tap-changer (LTC) or de-energized tap changer (DETC) from one tap to another, and the instructions to determine a pattern of the inductive components, capacitive components, or both further comprise instructions to determine the pattern for the phases for each of a plurality of taps.

12. The system of claim 11, wherein the another pattern is a stored record comprising inductive components, capacitive components, or both, for the plurality of phases of the target transformer.

13. The system of claim 11, wherein the another pattern is a stored record comprising inductive components, capacitive components, or both, for a plurality of phases of the benchmark transformer.

14. The system of claim 10, wherein the voltage at the first frequency and the voltage at the second frequency are equal.

15. The system of claim 10, wherein the voltage at the first frequency is above a nominal operating frequency of the target transformer and the second frequency is below the nominal operating frequency of the target transformer.

16. The system of claim 10, wherein the instructions executable by the processor to determine a pattern of the inductive components, capacitive components, or both comprises instructions executable by the processor to determine a pattern of the inductive components, capacitive components, or both for the plurality of phases.

17. A non-transitory machine-readable storage medium having stored thereon a computer program comprising instructions for performing diagnostics on a target transformer, the machine readable storage medium comprising instructions to control a voltage source to output a voltage to the target transformer at a first frequency;

instructions to receive a measurement of a magnitude and a phase angle of a first excitation current of the target transformer with respect to the voltage at the first frequency;

instructions to control the voltage source to output the voltage to the target transformer at a second frequency, the second frequency being greater than or less than the first frequency;

instructions to receive a measurement of a magnitude and a phase angle of a second excitation current of the target transformer with respect to the voltage at the second frequency;

instructions to determine, as a function of the magnitude and phase angle of the first excitation current and the second excitation current, an inductive component, a capacitive component, or both for the target transformer;

instructions to determine a pattern for the target transformer, the pattern formed by the inductive component, the capacitive component, or both;

instructions to compare the pattern formed by the inductive component, the capacitive component, or both with another pattern previously determined for the target transformer, a benchmark transformer, or both; and instructions to output a diagnostic analysis of the target transformer.

18. The machine readable storage medium of claim 17, wherein the instructions to determine the pattern further comprises instructions to apply different weights to the inductive component, the capacitive component, or both of the first excitation current, the second excitation current, or both.

19. The machine readable storage medium of claim 17, wherein instructions to compare the pattern comprises instructions to search a database to identify the benchmark transformer by comparison of the determined pattern for the target transformer to the another pattern associated with the benchmark transformer.

20. The machine readable storage medium of claim 17, wherein instructions to compare the pattern comprises instructions to search a database to identify the another pattern as a previously stored pattern of the target transformer.

* * * * *